(12) United States Patent
Liew et al.

(10) Patent No.: US 11,335,791 B2
(45) Date of Patent: May 17, 2022

(54) SEMICONDUCTOR DEVICE AND METHOD OF FABRICATION

(71) Applicants: Jerry Liew, Sarawak (MY); Jee Chang Lai, Sarawak (MY)

(72) Inventors: Jerry Liew, Sarawak (MY); Jee Chang Lai, Sarawak (MY)

(73) Assignee: X-FAB SARAWAK SDN. BHD., Sarawak (MY)

( * ) Notice: Subject to any disclaimer, the term of this patent is extended or adjusted under 35 U.S.C. 154(b) by 0 days.

(21) Appl. No.: 16/418,569

(22) Filed: May 21, 2019

(65) Prior Publication Data
US 2019/0355837 A1    Nov. 21, 2019

(30) Foreign Application Priority Data

May 21, 2018 (GB) ...................................... 1808290

(51) Int. Cl.
| | |
|---|---|
| H01L 29/66 | (2006.01) |
| H01L 29/786 | (2006.01) |
| H01L 21/762 | (2006.01) |
| H01L 21/28 | (2006.01) |
| H01L 21/311 | (2006.01) |
| H01L 21/02 | (2006.01) |
| H01L 21/3065 | (2006.01) |

(52) U.S. Cl.
CPC .. *H01L 29/66765* (2013.01); *H01L 21/02532* (2013.01); *H01L 21/28247* (2013.01); *H01L 21/3065* (2013.01); *H01L 21/31111* (2013.01); *H01L 21/76224* (2013.01); *H01L 29/78645* (2013.01)

(58) Field of Classification Search
None
See application file for complete search history.

(56) References Cited

U.S. PATENT DOCUMENTS

| | | | |
|---|---|---|---|
| 5,502,009 | A | 3/1996 | Lin |
| 5,716,863 | A | 2/1998 | Arai |
| 5,953,599 | A | 9/1999 | El-Diwany |
| 6,033,958 | A | 3/2000 | Chou |
| 6,225,163 | B1 | 5/2001 | Bergemont |
| 6,235,591 | B1 | 5/2001 | Balasubramanian et al. |
| 6,335,556 | B1 | 1/2002 | Kitazawa et al. |
| 6,410,387 | B1 | 6/2002 | Cappelletti et al. |
| 2003/0022460 | A1 | 1/2003 | Park |

(Continued)

FOREIGN PATENT DOCUMENTS

EP    2525396    11/2012

OTHER PUBLICATIONS

GB, Combined Search and Examination Report, GB Application No. 1808291.7 (dated Aug. 29, 2019).

(Continued)

*Primary Examiner* — Nilufa Rahim
(74) *Attorney, Agent, or Firm* — Thompson Hine LLP

(57) ABSTRACT

A method of fabricating a semiconductor device, including performing the following steps in the following sequence: providing a substrate including first and second gate regions separated by a trench formed in the substrate and growing a thin oxide layer on each of the first and second gate regions. The method further includes removing the thin oxide layer from the second gate region, and growing a thick oxide layer on the second gate region.

11 Claims, 4 Drawing Sheets

(56) References Cited

U.S. PATENT DOCUMENTS

| | | | |
|---|---|---|---|
| 2004/0147137 A1* | 7/2004 | Hiraiwa | H01L 21/28185 438/778 |
| 2005/0085042 A1 | 4/2005 | Chun et al. | |
| 2005/0277238 A1* | 12/2005 | Doumae | H01L 21/82345 438/197 |
| 2007/0243692 A1 | 10/2007 | Rudeck et al. | |
| 2007/0275529 A1* | 11/2007 | Arai | H01L 21/823462 438/289 |
| 2008/0124872 A1* | 5/2008 | Verma | H01L 21/823878 438/275 |
| 2008/0160736 A1 | 7/2008 | Alshareef et al. | |
| 2009/0243030 A1 | 10/2009 | Shih | |
| 2010/0164004 A1 | 7/2010 | Chatterjee et al. | |
| 2012/0306001 A1* | 12/2012 | Hirano | H01L 27/11573 257/324 |
| 2013/0049119 A1* | 2/2013 | Huang | H01L 21/823857 257/351 |
| 2013/0082318 A1* | 4/2013 | Liu | H01L 27/11546 257/324 |

OTHER PUBLICATIONS

GB, Combined Search and Examination Report, GB Application No. 1808290.9 (dated Aug. 15, 2018).

* cited by examiner

SEMICONDUCTOR DEVICE AND METHOD OF FABRICATION

This application claims priority to GB Application No. 1808290.9 filed on May 21, 2018, the entire contents of which are hereby incorporated by reference.

FIELD

The invention relates to the fabrication of integrated circuit devices and to the field of semiconductor device manufacturing.

BACKGROUND

In the more challenging types of System-on-Chip (SoC) solutions, the circuit can demand the integration of logic, mixed-signal, analog, non-volatile memory (NVM), High Voltage (HV) and Deep Trench Isolation (DTI) parts.

The integration requirements of each part are demanding and can conflict with each other. The standard prior art dual-gate fabrication process, illustrated in FIGS. 1 to 3, is unable to satisfactory fulfil the requirement of all parts concurrently. This is due to the creation of undesirable and challenging physical construct features due to demanding processing.

Referring to FIGS. 1 to 3, the challenges include:

High Shallow Trench Isolation (STI) field step height [A] causing process defect issues, reduced etch process margins, reduced patterning margins, and an unbalanced well profile between the STI region and active region.

Excessive STI divot (i.e. recess) [B] causing undesirable transistor behavior, STI edge related leakage, dislocation, and process defect issues.

STI field step height difference [C] between regions of different gate oxide thickness after the dual-gate fabrication process causing process defect issues and reduced patterning margins.

Excessive STI field oxide loss causing reduced STI depth [D] at thin gate oxide region causing lower isolation breakdown and higher diode junction leakage.

Sharp Gate/Poly edges [E] causing reduced reliability lifetime.

An improved fabrication process may enable a robust integration of the different parts.

SUMMARY

In one embodiment the invention provides semiconductor devices and methods of fabricating such, as set out in the accompanying claims. In one case, the invention is a method of fabricating a semiconductor device, the method including performing the following steps in the following sequence: providing a substrate including first and second gate regions separated by a trench formed in the substrate wherein the substrate is divided into a first area which includes the first gate region and a first part of the trench and a second area which includes the second gate region and a second part of the trench. The method can further include the steps of: growing a thin oxide layer on each of the first and second gate regions; depositing a polysilicon layer on the thin oxide layer; depositing a photoresist layer on the layer of polysilicon, exposing the photoresist and removing the photoresist layer from the second area; removing the polysilicon layer from the second area; removing the thin oxide layer from the second gate region using a wet etch, wherein the polysilicon layer in the first area protects the thin oxide layer in the first gate region; growing a thick oxide layer on the second gate region and on the polysilicon layer in the first area; depositing a further photoresist layer on the thick oxide layer, exposing the further photoresist and removing the further photoresist layer from the first area; removing the thick oxide layer from the polysilicon layer in the first area; depositing a further polysilicon layer over the first and second areas; and selectively removing portions of the further polysilicon layer using a photoresist and dry etching to form two gates of the semiconductor device.

Certain embodiments will now be described, by way of example only, with reference to the accompanying figures.

BRIEF DESCRIPTION OF THE FIGURES

FIG. 1 is shown after STI Chemical Mechanical Polishing (CMP) and oxide etches to achieve the required STI field step height [A] for subsequent processing;

DETAILED DESCRIPTION

We now describe a method of growing gate oxide layers of different thicknesses with minimum variation of Shallow Trench Isolation (STI) step height. The method may involve reversing the order of the dual gate oxide formations, and growing a thin Gate oxide before growing a thick Gate oxide. The thick oxide and the thin oxide may be thermal oxides, grown by a furnace process. Alternatively, the thin oxide may be an In-Situ Steam Generation (ISSG) oxide. The thickness of the thick oxide is typically within the range of 60 A to 180 A, to operate at a supply voltage ($V_{dd}$) of about 3 V to 5.5 V. The thickness of the thin oxide is typically within the range of 18 A to 32 A, to operate at about 1.0 V to 1.8 V $V_{dd}$. In this specification the unit of angstrom, being 0.1 nanometers, is abbreviated simply by the letter A.

The method may involve forming oxide layers on a dual gate device, including providing a silicon substrate; growing a thin oxide on the substrate; depositing a thin layer of polysilicon (hereinafter referred to simply as "poly") on top of the thin oxide; providing a coating of photoresist over the poly; exposing and developing the photoresist to expose a portion of the thin poly, whilst leaving the thin oxide area covered by the photoresist; performing dry etching to remove the exposed poly, performing wet etching to remove the thin oxide, whilst leaving the thin oxide area covered by the poly; removing the photoresist; growing a thick oxide layer on the silicon substrate and on top of the poly; coating the device using a photoresist; exposing and developing the photoresist to expose the poly in the thin oxide area; performing wet etching to remove the exposed thick oxide in the thin oxide area; removing the photoresist; depositing gate poly; exposing and developing the photoresist to shield the gate poly; performing dry etching to remove the exposed poly, thus forming the gates.

The method enables a robust integration of the different parts during semiconductor device fabrication. The method also fulfils the requirements of all parts concurrently for the dual-gate fabrication process.

Figure 1:
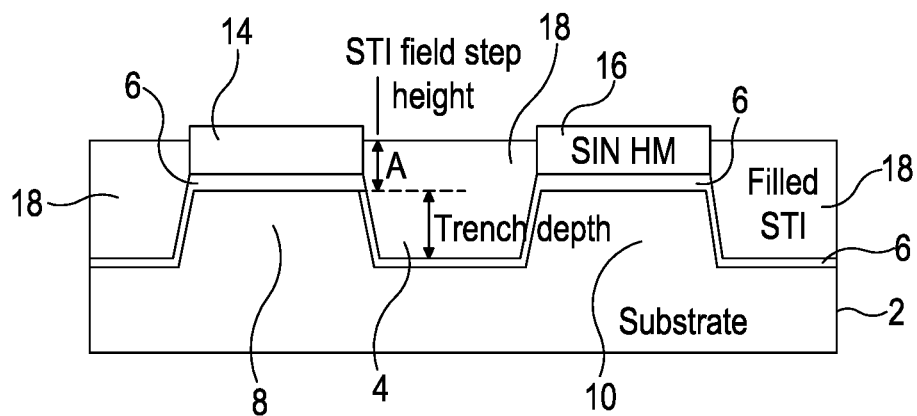
FIG. 1 shows a prior art method in which a thick oxide layer is grown before creating a thin oxide layer.
Figure 2:
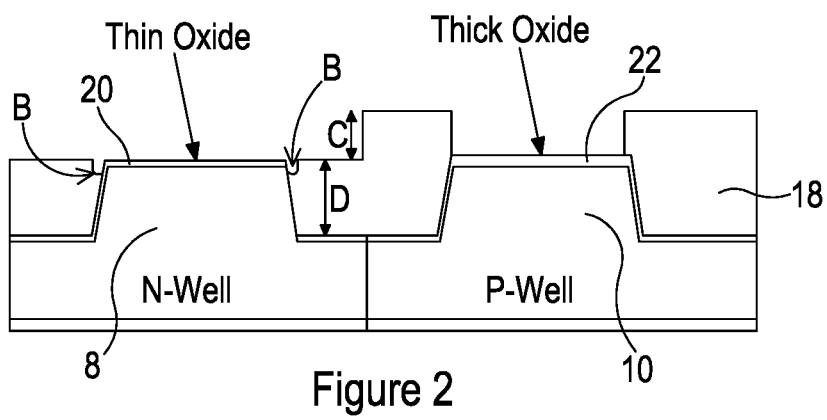
FIG. 2 shows a subsequent step in the prior art process after the thick oxide layer has been removed from unnecessary areas.
Figure 3:
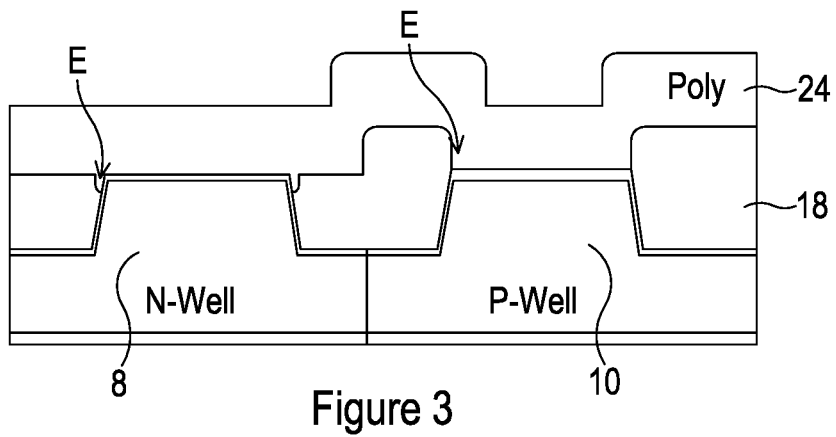
FIG. 3 shows a subsequent step in the prior art process after Gate Poly deposition.

FIGS. 1 to 3 show steps in a prior art process.

FIG. 1 shows a substrate 2 on which two gates 8 and 10 are formed with a trench 4 therebetween. The substrate 2 is coated with an oxide layer 6, on top of which SiN Hardmasks (SIN HMs) 14 and 16 are formed above the two gates 8 and 10 respectively. The trench 4 is filled with a Shallow Trench Isolation (STI) material 18 (e.g. silicon dioxide or another dielectric material), as are the regions outside the gates 8 and 10.

FIG. 1 shows the device after Chemical Mechanical Polishing (CMP) of the Shallow Trench Isolation (STI) material 18, and after oxide etching to achieve the required STI field step height [A] for subsequent processing. In the prior art, this height [A] can range from 600 A to 1400 A, translating to an initial SiN Hardmask (SIN HM) deposition thickness of 1100 A to 2100 A. This range is suitable for a simple dual-Gate logic-only integration to a comprehensive parts integration for System-on-Chip (SoC) solutions. The method described herein can reduce the required field step height [A] to a maximum of 600 A, translating to an initial SIN HM deposition thickness of a maximum of 1200 A.

FIG. 2 shows a subsequent step in the prior art process after the formation of a thin oxide region 20 on gate 8, and a thick oxide region 22 on gate 10, just prior to a step of Gate Poly deposition (shown in FIG. 3). The thick oxide 22 is grown first and then removed from unnecessary areas. This process results in the formation of a divot [B] (i.e. a recess in the STI material 18) at each side of the thin oxide gate 8, as shown in FIG. 2. In addition, this process results in the formation of an STI step height difference [C] and a reduced STI depth [D], as shown in FIG. 2. In the prior art, the (vertical) depth of the STI divot [B] can range from 100 A to 300 A. The method described herein eliminates the STI divot [B]. In the prior art, the STI field step height difference [C] can range from 200 A to 300 A. The method described herein can minimise [C] to a maximum of 60 A. In the prior art, STI field oxide loss can reduce the STI depth [D] to 200 A below the thin oxide region 20 on the silicon surface. The method described herein can maintain the STI depth [D] at a desired 200 A above the thin oxide region 20, regardless of different parts integration.

FIG. 3 shows the prior art process after the deposition of polysilicon 24 above the oxide layers 20 and 22. In the prior art, sharp Gate/Poly edges [E] are created at the edges of the gates 8 and 10 due to the STI divots [B] and the STI step height difference [C] respectively. The method described herein eliminates the formation of the sharp edges [E].

We now describe a method which involves reversing the order of the dual gate oxide formations, and growing a thin Gate oxide before growing a thick Gate oxide.

Front End of Line (FEOL) integration (i.e. the first steps in the fabrication process) is the same until well activation is done and the sacrificial oxide (sac ox) is removed.

Figure 4:
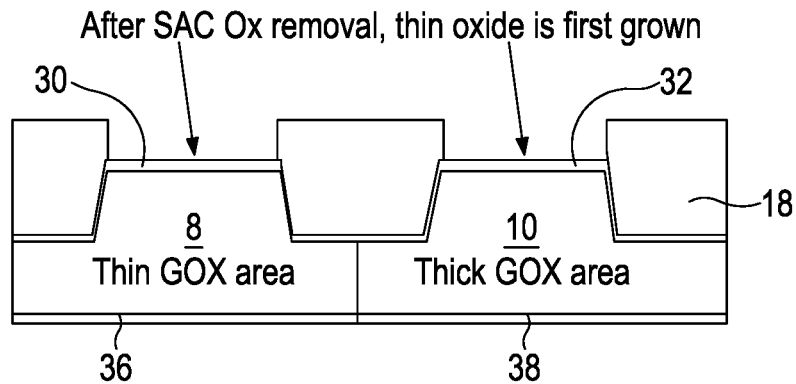
FIG. 4 shows the start of an improved process in which a thin oxide layer is grown before a thick oxide layer is provided.

FIG. 4 shows a step of an improved method. After the sacrificial oxide (not shown) is removed thin oxide layers 30 and 32 are grown on gates 8 and 10 respectively.

Figure 5:
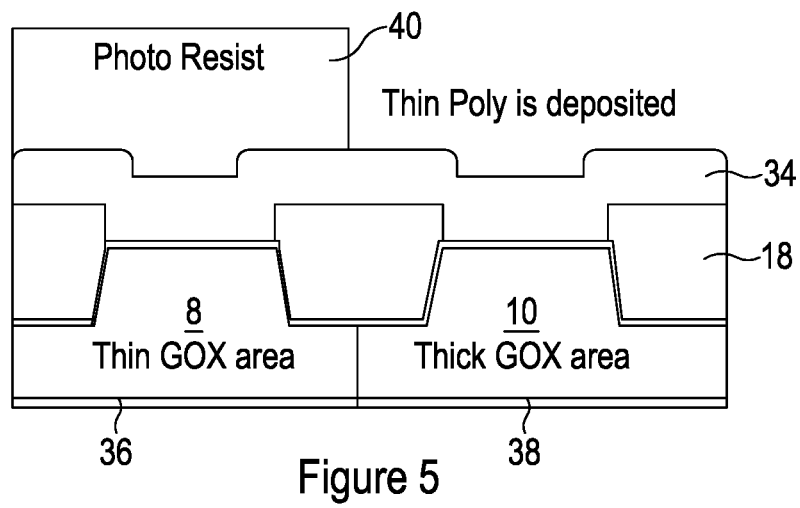
FIG. 5 shows a subsequent step in which a thin polysilicon layer is deposited on the thin oxide layer, and a photoresist is then applied, exposed and selectively removed.

FIG. 5 shows a subsequent step in which a thin poly layer 34 (with a thickness in the range of about 200 A to 500 A) is deposited on the surface of the device, covering the thin oxide layers 30 and 32. This poly layer acts as a protective layer for the thin oxide layer 30 in the subsequent step. As shown in FIGS. 4 to 11, the device is divided into a thin Gox (Gate oxide) area 36 and a thick Gox (Gate oxide) area 38. The thin Gox area 36 includes within it the first gate 8 and part of the trench 4, and the thick Gox area 38 includes within it the second gate 10 and part of the trench 4. The thin poly layer 34 is then coated in a photoresist 40, which is then exposed and partially removed to reveal the thick Gox area 38, whilst leaving the thin Gox area 36 covered in photoresist.

Figure 6:
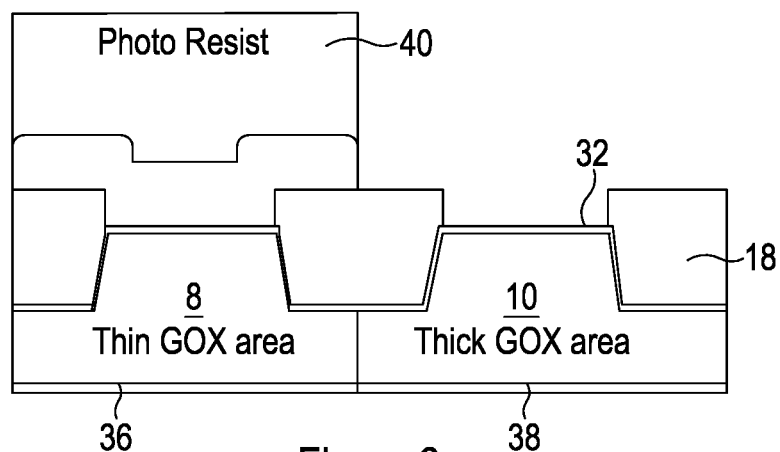
FIG. 6 shows a subsequent step, in which an area of the thin poly layer is removed by dry etching.

FIG. 6 shows a subsequent stage in the method, after the thin poly layer 34 has been etched from the thick Gox region 38, stopping just before the thin oxide layer 32 on the second gate 10.

Figure 7:
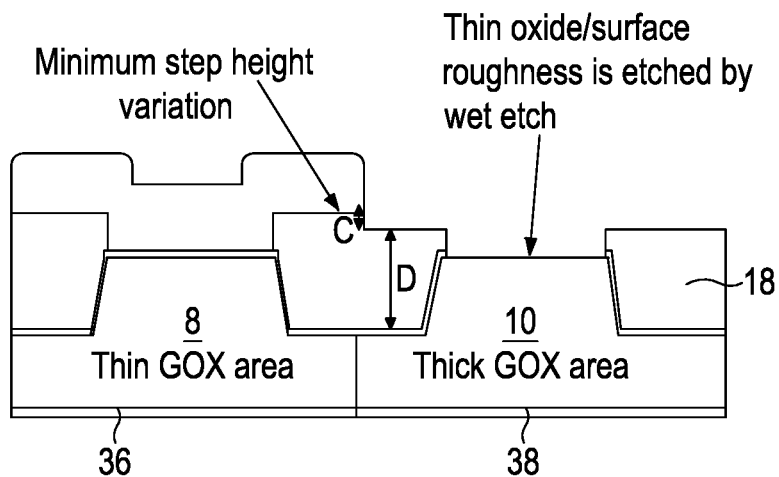
FIG. 7 shows a subsequent step, in which the thin oxide layer on one of the gates is removed by wet etching.

FIG. 7 shows a subsequent step in the method. The thin oxide layer 32 on the second gate 10 is etched by wet etch. This process causes a small step height difference [C] between the thin and thick Gox regions 36 and 38. As a result of the short etching duration required to remove thin oxide layer 32, the variation [C] is minimal (in the region of 30 A to 60 A) compared to a normal dual gate process. Also, due to the short etching duration required to remove the thin oxide layer 32, it is possible to maintain the STI depth [D] at a desired 200 A above the thin oxide region silicon surface regardless of different parts integration.

Figure 8:
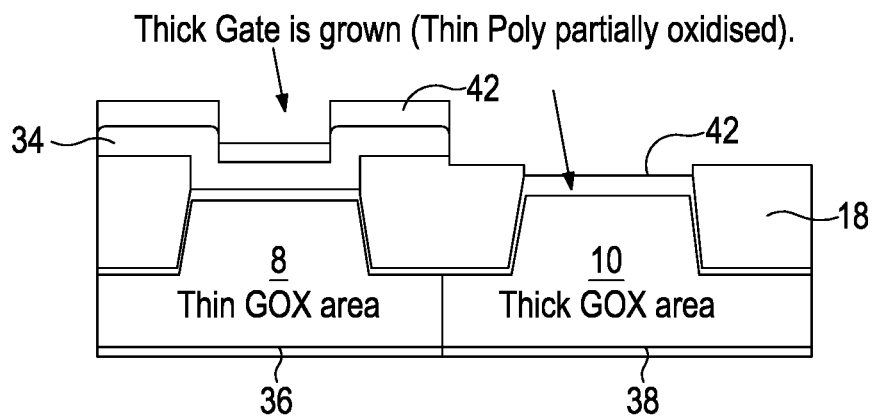
FIG. 8 shows a subsequent step, in which a thick oxide layer is grown.

FIG. 8 shows a subsequent step in which a thick gate oxide layer 42 is grown in the thick Gox region 38 by covering the surface of the silicon substrate layer 2, and in the thin Gox region 36 by partially covering the thin polysilicon layer 34.

Figure 9:
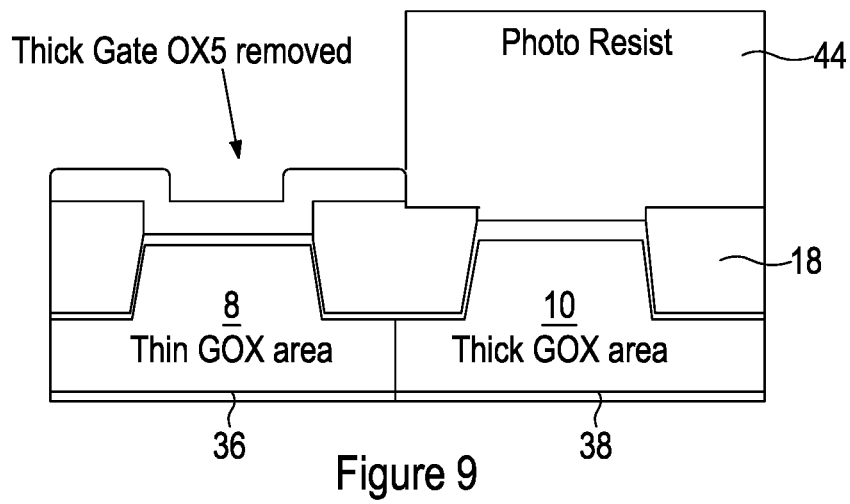
FIG. 9 shows a subsequent step, in which a photoresist layer is added, exposed and selectively removed.

FIG. 9 shows a subsequent step in which a photoresist layer 44 is applied, selectively exposed, and removed from the thin Gox area 36 whilst being left in the thick Gox area 38. This allows the thick gate oxide layer 42 to be removed from the thin Gox region 36 by etching (e.g. HF wet etch), while the thick oxide in the thick Gox region 38 is protected by the photoresist layer 44.

Figure 10:
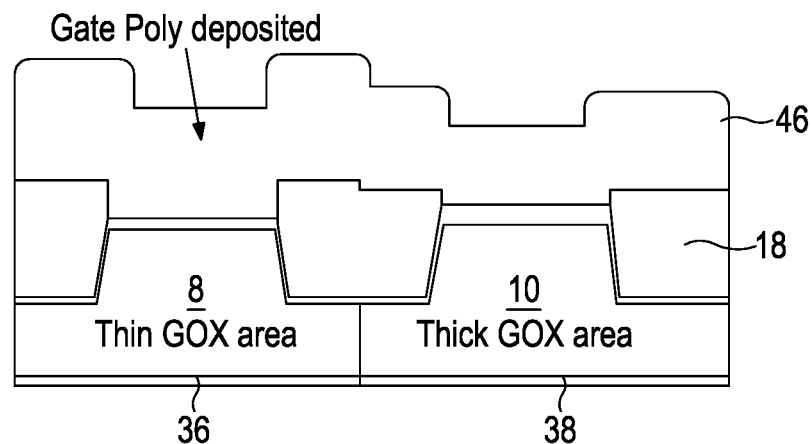
FIG. 10 shows a subsequent step, in which further polysilicon is deposited.

FIG. 10 shows deposition of more gate polysilicon 46 (to a thickness of about 1500 A to 2000 A), which will be used to form gate electrodes. Although not illustrated, normal Gate patterning sequences may be performed after this step. The only difference is during the Gate Etch, where the etching duration is increased to fully complete the Gate patterning in the thin Gox region 36. This is possible due to a high Poly to oxide etch selectivity (50:1).

Figure 11:
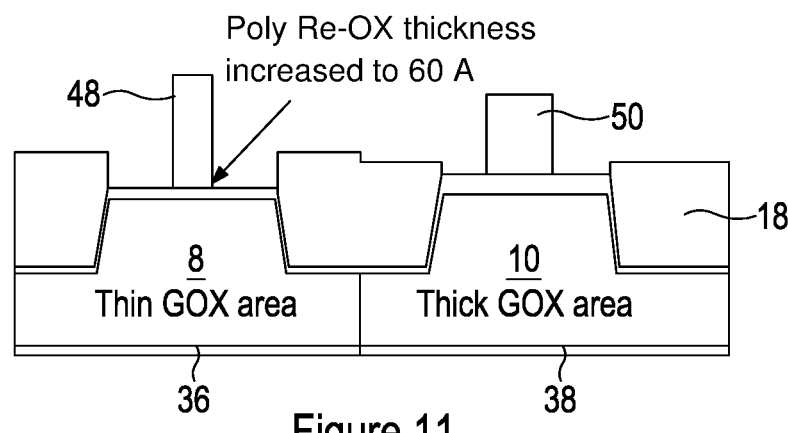
FIG. 11 shows the formation of gates after the use of a photoresist layer and dry etching.

FIG. 11 shows the etched gate polysilicon regions 48 and 50 before the Poly Re-OX step, wherein the Poly surface is oxidized. The poly re-ox thickness (not shown) is increased to 60 A to improve the bird's beak formation and cure undercut/notching of the Gate at the thick Gox region 38 due to the increased etching duration.

The method is particularly suitable for use as a semiconductor device Dual Gate fabrication process, such as for example a 5V device with a thick oxide and a 1.5V device with a thin gate oxide. The variation of step height will be huge is a challenge for the device robustness.

Each feature disclosed or illustrated in the present specification may be incorporated in the invention, whether alone or in any appropriate combination with any other feature disclosed or illustrated herein.

What is claimed is:

1. A method of fabricating a semiconductor device, said method comprising performing the following steps in the following sequence:
    providing a substrate comprising first and second gate regions separated by a trench formed in said substrate wherein said substrate is divided into a first area which includes said first gate region and a first part of said trench and a second area which includes said second gate region and a second part of said trench;
    growing a thin oxide layer on each of said first and second gate regions wherein said thin oxide layer has a thickness in the range of 18 A to 32 A;
    depositing a polysilicon layer on said thin oxide layer;
    depositing a photoresist layer on said layer of polysilicon, exposing said photoresist and removing said photoresist layer from said second area;
    removing said polysilicon layer from said second area;
    removing said thin oxide layer from said second gate region using a wet etch, wherein said polysilicon layer in said first area protects said thin oxide layer in said first gate region;
    thermally growing a thick oxide layer on said second gate region and on said polysilicon layer in said first area, wherein said thick oxide layer has a thickness in the range of 60 A to 180 A;
    depositing a further photoresist layer on said thick oxide layer, exposing said further photoresist and removing said further photoresist layer from said first area;
    removing said thick oxide layer from said polysilicon layer in said first area;
    depositing a further polysilicon layer over said first and second areas; and
    selectively removing portions of said further polysilicon layer using a photoresist and dry etching to form two gates of said semiconductor device.

2. The method as claimed in claim 1, which further comprises providing a Shallow Trench Isolation (STI) material in said trench.

3. The method as claimed in claim 2, wherein said step of removing said thin oxide layer from said second gate region reduces a surface level of said STI material by no more than 60 angstrom.

4. The method as claimed in claim 2, wherein, after removing said thin oxide layer, a first surface level of said STI material in said first area differs by no more than 60 angstrom from a second surface level of said STI material in said second area.

5. The method as claimed in claim 2, wherein, after removing said thin oxide layer, a surface level of said STI material in said second area is at least 100 angstrom above a surface of said second gate region.

6. The method as claimed in claim 2, wherein, after removing said thin oxide layer, a surface level of said STI material in said second area is at least 180 angstrom above a surface of said second gate region.

7. The method as claimed in claim 1, wherein said first and second parts of said trench together form the whole of said trench.

8. The method as claimed in claim 1, wherein said polysilicon layer is removed from said second area using dry etching.

9. The method as claimed in claim 1, wherein said substrate is a silicon substrate.

10. The method as claimed in claim 1, wherein said semiconductor device is a dual gate semiconductor device.

11. The method as claimed in claim 1, and further comprising:
    performing polysilicon re-oxidation to oxidise the polysilicon layer and further polysilicon layer of said two gates, wherein the re-oxidation thickness is increased to 60 A.

* * * * *